April 16, 1968 R. C. BRANDRIFF 3,378,197

FLUONIC BINARY COUNTER USING FLUID LOGIC UNITS

Filed June 29, 1966

Witness

Rosalind Tsai

INVENTOR.

Robert C. Brandriff

BY

Marshall J. Breen

ATTORNEY

United States Patent Office 3,378,197
Patented Apr. 16, 1968

3,378,197
FLUONIC BINARY COUNTER USING FLUID LOGIC UNITS

Robert C. Brandriff, Williamstown, N.J., assignor to The Singer Company, New York, N.Y., a corporation of New Jersey Filed June 29, 1966, Ser. No. 561,561
1 Claim. (Cl. 235—201)

ABSTRACT OF THE DISCLOSURE

A binary counter stage employing a pair of fluid amplifiers, respectively as director- and counter-elements, is disclosed. The feedback coupling from the counter-element to the director-element is direct, and such feedback is emphasized as being from a control port of the counter-element to a control port of the director-element. The output of the counter-element is applied for readout purposes, or for switching the director-element of the next higher stage.

The present invention relates in general to fluid binary counters and stages thereof, and in particular to such counters and stages as may employ Coanda or wall attachment type fluid flip flop amplifiers of the type having respective pairs of control ports for each of two output legs. Such a fluid amplifier is shown and described in co-pending application Ser. No. 564,933.

*The prior art*

Fluid binary counters employ, usually, pairs of fluid flip flop amplifiers per counter stage, one amplifier of which is adapted to receive input pulses and is called a director element, and the other amplifier of which is adapted to receive fluid under steady pressure and is the output or counter element. To assure that the counter element is always set to count properly, feedback is necessary between the counter element and the director element. The prior art as typified by United States Patent No. 3,001,698 (FIG. 4 thereof) relies on feedback intrinsic to the coupling between the director and counter elements, which feedback has not proved completely fail-safe and has on occasion resulted in erroneous counts. The prior art as exemplified by United States Patent No. 3,223,101 overcomes the problems associated with "intrinsic feedback" by employing direct feedback between the counter and director elements, however at the expense of output fluid. That is, the direct feedback technique of the last mentioned patent is to tap off a portion of some of the output fluid from the counter element, and to use such tapped fluid for feedback purposes.

*The invention*

Rather than use a portion of the output fluid from the counter element for feedback purposes, the invention uses to full advantage both control ports of each of the output legs of a flip flop amplifier as shown in co-pending application Ser. No. 564,933, and in no way taps or hinders fluid flow from the output of the counter element. More specifically, the director element of the instant counter stage is adapted to apply selectively its output pulses to either a control port of the counter output leg or to a control of the other counter output leg, using the free control ports of each of such legs to feed back pressure signals directly to the director element.

A principal object of the invention is to provide an improved binary counter stage employing fluid amplifier flip flop elements.

Another object of the invention is to provide a binary counter stage having director and counter elements with improved feedback therebetween.

The invention will be described with reference to the figures, wherein.

Since the invention in its presently preferred form employs Coanda amplifiers like the unit shown and described in co-pending application Ser. No. 564,933, the same character notations as employed in that application are herein used for the corresponding parts of the circuit of FIG. 1.

Figures 1, 2:
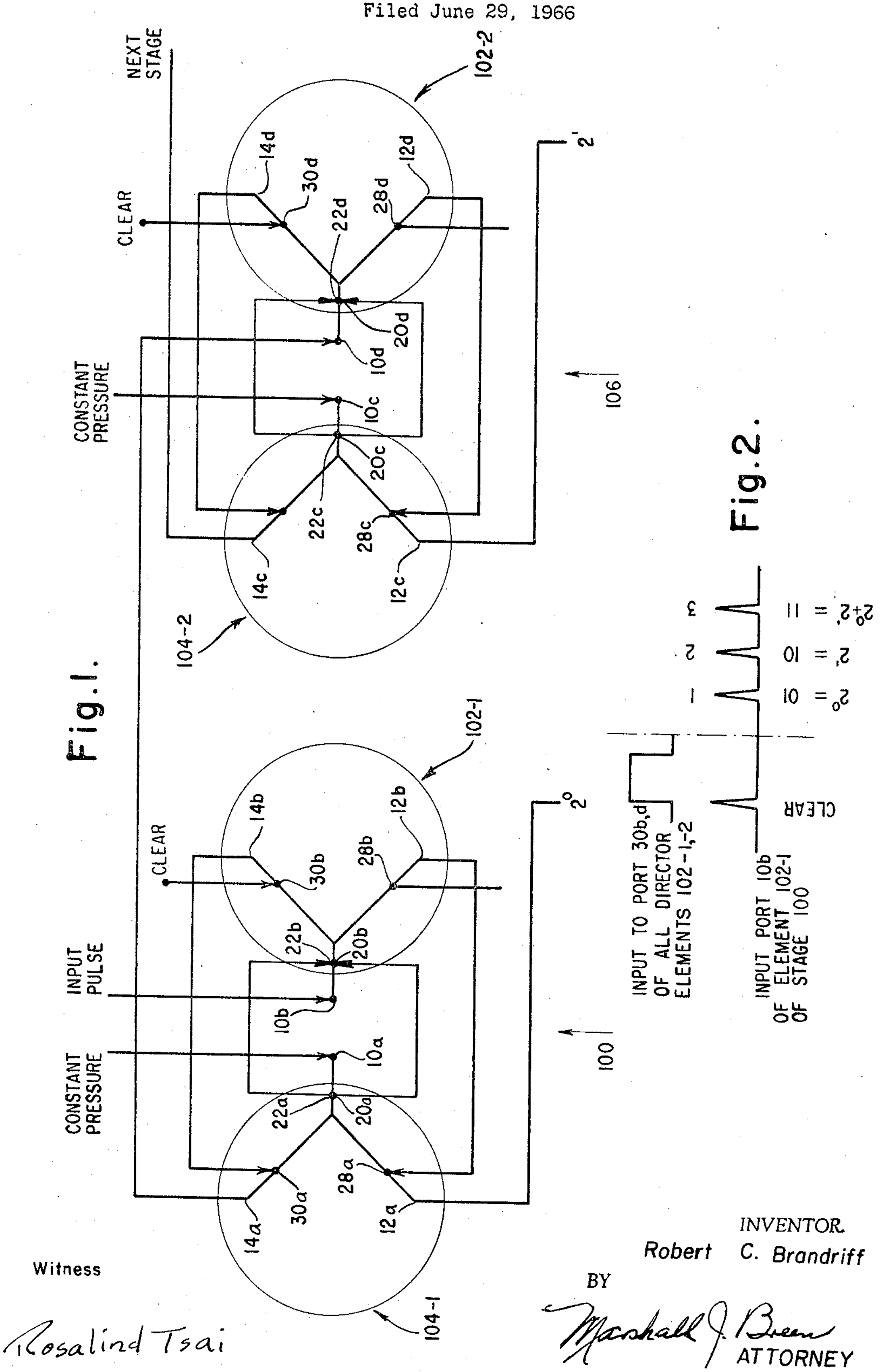
FIG. 1 is a schematic diagram of a fluid circuit employing the invention.
FIG. 2 is a pulse diagram useful in describing the operation of the circuit of FIG. 1.

Referring now to FIG. 1, the first stage 100 of a two-stage binary counter has a director element 102–1, the input **10*b* of which is adapted to receive fluid pulses of predetermined duration. The output port 12*b* of the director element 102–1 applies its output fluid pulses to the "downstream" control port 28*a* of the counter element 104–1; and the output port 14*b* of the director element 102–1 applies its output pulses to the "downstream" control port 30*a* of the counter element 104–1. The counter element control ports 20*a* and 22*a* over which low pressure Coanda bubbles form are just upstream of the respective fluid lock-on points and are connected by conduits to respectively the bubble-positioned control ports 20*b* and 22*b* of the director element 102–1, whereby direct feedback is provided between the counter element 104–1 and the director element 102–1 without affecting the fluid output of the counter element 104–1. The input 10*a* of the counter element 104–1 is adapted to receive fluid at steady pressure, and the fluid output at the ports 12*a* and 14*a* of the counter element 104–1 are used respectively to indicate whether the stage 100 is storing a ONE or ZERO, and to relay pulses to the next higher stage 106 of the counter. The counter stage 106 is identical to the stage 100 with the one exception that its applied switching fluid is received from the output leg 14*a* of the counter element 104–1 of the stage 100. To set each stage to ZERO for establishing initial conditions for counting purposes, a pulse is applied to the downstream control ports 30*b* and 30*d* of the director elements 102–1 and 102–2, while simultaneously applying a pulse to the input port 10*b* of the first stage 100. The downstream control ports 28*b* and 28*d*** of the director elements of each stage are disconnected and remain floating.

Taking FIGS. 1 and 2 together, the operation of the circuit of FIG. 1 will now be described: With the two CLEAR pulses depicted in FIG. 2 applied simultaneously to the indicated ports, a fluid pulse is directed first down the output leg **12*b* of the director element 102–1, ultimately being applied to the downstream control port 28*a* of the counter element 104–1 of the first stage 100. This causes the constant pressure fluid of the first stage to switch to the output leg 14*a* of the first stage counting element 104–1. This produces a fluid flow into the port 10*d* of the director element 102–2 of the second stage which because of the application of the CLEAR pulse to the port 30*d* of that element, causes fluid to flow from the output leg 12*d* of the second stage director element 102–2 to the downstream control port 28*c* of the second stage counter element 104–2. As with the first stage, fluid flow is then directed from the output leg 14*c* of the second stage counter element 104–2** to set the third stage (not shown), and so forth.

Assume now the successive application of the three pulses of FIG. 2 to the counter input, i.e. the port **10*b* of the director element 102–1 of the first stage 100. Since fluid is at this time flowing in the leg 14*a* of the first stage counter element 104–1, a low pressure Coanda bubble is produced across the control port 22*a* of that element. This low pressure is directly fed back and applied to the control port 22*b* of the first stage director element 102–1** and, on receipt of the first of the pulses to be counted, causes such pulse to be propagated out of the leg **14*b* of the first stage director element 102–1. That is, the first of the count pulses sees a low pressure in the element 102–1 leg 14*b* and accordingly flows down the leg 14*b* to the downstream control port 30*a* of the first stage counter element 104–1. This causes the counter element 104–1 of the first stage to switch and direct the constant pressure fluid out its leg 12*a*, thereby indicating a ONE ($2^0$) count for the stage 100. With fluid now flowing down the leg 12*a* of the first stage counting element 104–1, a low pressure Coanda bubble appears across the port 20*a* of that element. This low pressure is directly fed back to the control port 20*b* of the first stage director element 102–1, there to cause the next pulse to be counted to flow down and out the leg 12*b* of the director element 102–1**.

With the second pulse to be counted flowing to the control port **28*a* of the first stage counter element 104–1, that element 104–1 again switches, thereby registering a ZERO as the output count of the first stage 100, and applying a fluid pressure to the input port 10*d* of the second stage director element 102–2. Since the second stage 106 had previously been cleared, a low pressure had been fed back from the port 22*c* of the second stage counter element 104–2, as above, to the port 22*d* of the director element 102–2 of that stage, whereby fluid flow is out of the leg 14*d* of the second stage director element 102–2. This causes the fluid of the second stage counter element 104–2 to switch and flow out the leg 12*c* thereof to indicate a ONE in the second stage 106, i.e. the second stage indicates a ONE ($2^1$) count while at this time the first stage 100** indicates a ZERO.

Application of the third pulse causes the first stage 100 to switch again to indicate a ONE, i.e. a $2^0$ count in the first stage 100 plus a $2^1$ count in the second stage 106 produces the decimal count "three." This is brought about, as above, because the low pressure of the Coanda bubble across the control port **22*a* of the first stage counter element 104–1 is at this time fed back (after application of the second pulse) to the control port 22*b* of the first stage director element 102–1, thereby creating a low resistance path for the third pulse in the leg 14*b* of the first stage director element 102–1 which pulse on being applied to the control port 30*a* of the first stage counter element 104–1 causes that element to store a ONE. Since no fluid flows at this time from the first stage 100 to the second stage 106**, the second stage remains unaffected by the third pulse.

While the invention has been described in its preferred form, it is to be understood that the words which have been used are words of description rather than of limitation and that changes within the purview of the appended claim may be made without departing from the true scope and spirit of the invention.

Having thus set forth the nature of the invention, what is claimed herein is:

1. A binary counter stage comprising first and second wall attachment type flip flop amplifiers, said first amplifier being provided with an input port and at least two output ports, and said second amplifier being provided with an input port and at least two output ports, the input port of said first amplifier being adapted to receive fluid pulses and the input port of said second amplifier being adapted to receive fluid under substantially constant pressure, said first amplifier being provided with a first control port for controlling fluid flow to one of the output ports of the first amplifier and with a second control port for controlling fluid flow to the other output port of the first amplifier, said second amplifier being provided with first and second control ports both of which may be for controlling fluid flow to one of the output ports of the second amplifier and with third and fourth control ports which may be for controlling fluid flow to the other output port of the second amplifier, the output fluid from the output port of the first amplifier that is controlled by said first control port of that amplifier being applied to the first control port of said second amplifier and the pressure of said second control port of said second amplifier being applied to the first control port of the first amplifier, the output fluid from the output port of the first amplifier that is controlled by said second control port of that amplifier being applied to the third control port of said second amplifier and the pressure of said fourth control port of said second amplifier being applied to the second control port of said first amplifier, the fluid from the respective output ports of said second amplifier being useful to indicate a count and to excite a succeeding counter stage, said first and third control ports of said second amplifier locate proximate, but downstream of, the respective wall attachment points of the second amplifier, and wherein the second and fourth control ports of that amplifier are at such respective points.

References Cited

UNITED STATES PATENTS

| | | | |
|---|---|---|---|
| 3,001,698 | 9/1961 | Warren | 235—61 |
| 3,114,390 | 12/1963 | Glattli | 137—597 |
| 3,305,170 | 2/1967 | Zilberfarb | 235—201 |

RICHARD B. WILKINSON, *Primary Examiner.*

STEPHEN J. TOMSKY, *Examiner.*

L. R. FRANKLIN, *Assistant Examiner.*